United States Patent [19]

Zaidenweber

[11] Patent Number: 4,558,284
[45] Date of Patent: Dec. 10, 1985

[54] DIGITAL FREQUENCY-MODULATED DEMODULATION

[75] Inventor: Gary A. Zaidenweber, St. Paul, Minn.

[73] Assignee: Medtronic, Inc., Minneapolis, Minn.

[21] Appl. No.: 588,838

[22] Filed: Mar. 12, 1984

[51] Int. Cl.$^4$ .............................................. H03D 3/04
[52] U.S. Cl. .................................... 329/126; 329/110; 329/122
[58] Field of Search ............... 329/104, 107, 110, 122, 329/126; 375/80, 94; 455/214, 337

[56] References Cited

U.S. PATENT DOCUMENTS

| | | | |
|---|---|---|---|
| 3,670,250 | 6/1972 | Fritkin | 329/104 |
| 4,232,267 | 11/1980 | Hanajima et al. | 328/138 |

*Primary Examiner*—Eugene R. LaRoche
*Assistant Examiner*—James C. Lee
*Attorney, Agent, or Firm*—Reed A. Duthler; Joseph F. Breimayer; John L. Rooney

[57] ABSTRACT

The frequency-modulated demodulator is provided in which the frequency-modulated signal as having a relatively narrow range of frequency modulation is demodulated by providing a pulse which corresponds to the positive half-wave cycles of the signal and then generating an extended duration pulse from the initiation of the first pulse produced to the second pulse produced in two consecutive cycles. In this manner every other cycle of the FM demodulated signal provides an output pulse which substantially corresponds to the duration of one cycle of the FM signal. A high frequency clock on the order of 1,000 times faster than the frequency of the extended duration signals is gated through for substantially the entire width of the extended pulse duration. The number of clock pulses that are gated through or counted to provide an indication of the frequency signal, a sampled basis corresponding to every other cycle of the FM signal.

2 Claims, 2 Drawing Figures

DIGITAL FREQUENCY-MODULATED DEMODULATION

BACKGROUND OF THE INVENTION

The present invention is directed to a demodulation technique for extracting information from a radio frequency signal which is capable of providing either a digital of an analog representation of a frequency-modulated (F.M.) signal. The digital or analog output may be coupled to additional data processing equipment which utilizes the frequency-modulated signal in order to extract the modulated information therefrom.

Previously it has been common practice to demodulate an incoming FM signal to an analog waveform and then to convert it to a digital waveform by an analog-to-digital conversion. This procedure is subject to a relatively high degree of error and loss of information, and requires continual attention by the data processing unit which receives the demodulated information. In addition, a considerable amount of hardware equipment is required to implement this system. One other disadvantage of this type of prior system is that "out-of-range" signals require separate detector circuits, whereas the present invention can recognize out-of-range signals simply by recognizing an out-of-range digital count.

Prior systems have also employed phase-locked loop circuits for demodulation. This type of circuit tends to generate noise in every stage and, in addition, there tends to be a loss of the locking action of the circuit when there is a step change in the incoming frequency. Moreover, sampling of the signal is done only after noise has been added in the circuit. The digital frequency-modulated demodulator of the present invention overcomes these deficiencies. The necessity of using high "Q" narrow band pass filters is also eliminated with the present invention, which represents a decided advantage over prior demodulation techniques.

DESCRIPTION OF THE DRAWINGS

The present invention is described by reference to the drawings in which.

TECHNICAL DESCRIPTION OF THE INVENTION

Figure 1:
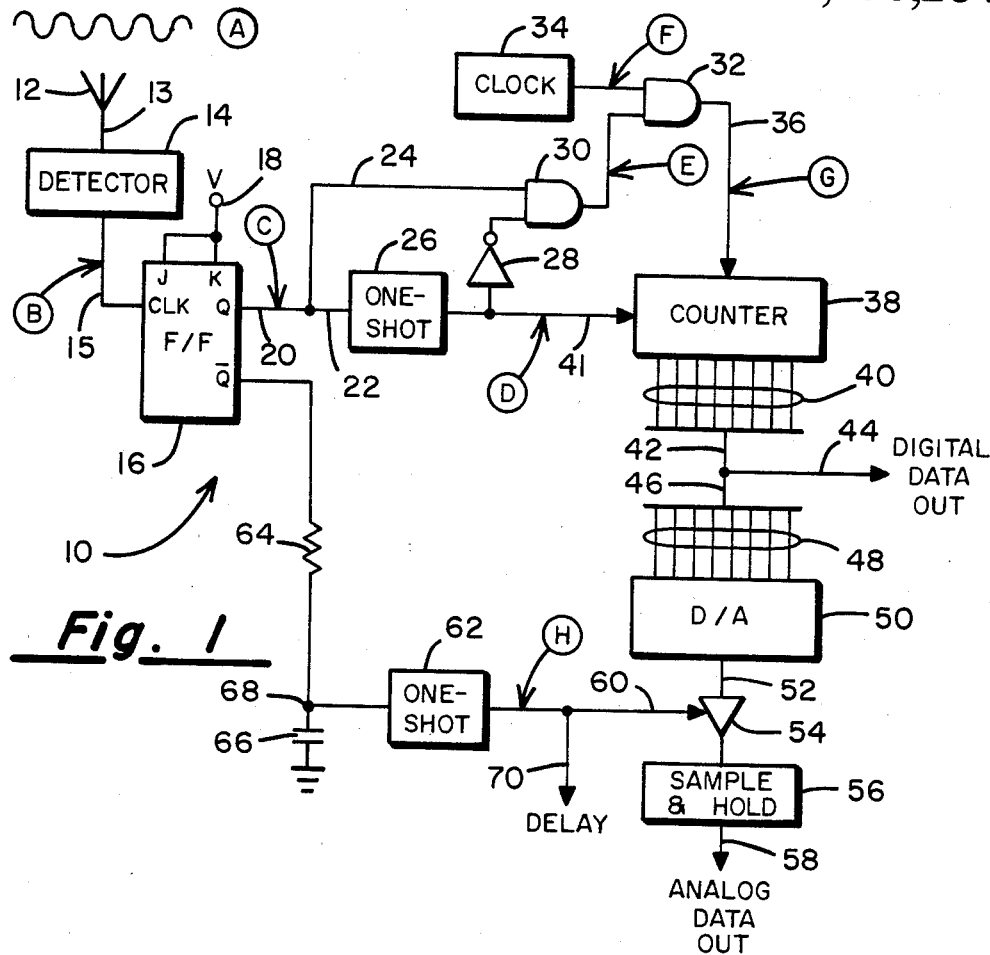
FIG. 1 is a block diagram of a circuit for implementing the present invention.
Figure 2:
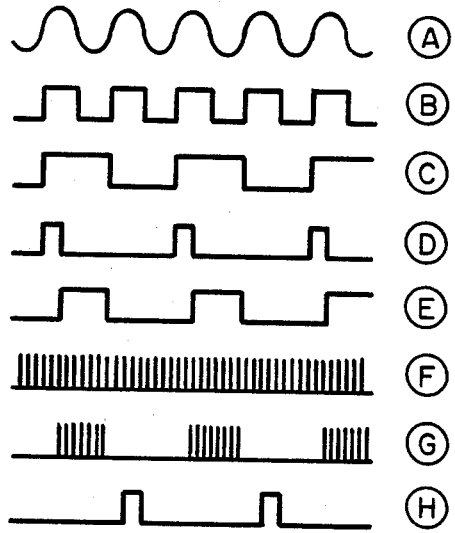
FIG. 2 is a diagram showing signal waveforms at various points in the circuit of FIG. 1.

The digital FM demodulator 10 of the present invention receives a frequency modulated waveform at the antenna 12, which is indicated by capital A at the input to the antenna in FIG. 1, and in FIG. 2 where it is shown relative to the other waveforms of the circuit. The waveform A signal received by the antenna 12 is coupled to a detector 14 which is capable of producing a series of pulse output signals (Waveform B) wherein there is at least one output pulse for each half cycle of the incoming Waveform A. The detector 14, for example, may be a level detector if the amplitude of the incoming signal is known to fall within detectable limits or to be relatively constant. Another type of detector that could be employed would be a zero crossing detector which would produce output pulses with a width approximately equal to the width of the corresponding cycle of the FM (Waveform A) signal.

The output Waveform B of the detector 14 is a series of pulses, the width of which vary on a cycle-to-cycle basis with the frequency of the Waveform signal A. Since each cycle of Waveform A signal is detected, the term "frequency" for purposes of this invention is the reciprocal of the period of each cycle on a cycle-by-cycle basis. The Waveform signal B is coupled to the clock input terminal of JK flip-flop 16. The J and K inputs of the flip-flop 16 are connected to terminal 18 which is coupled to a positive voltage to provide logic level "1" signals to these inputs.

The flip-flop 16, therefore, operates in a toggling manner so that it changes states in accordance with level changes of Waveform B. The Q output signal, which is provided on the output line 20 thus changes state once for each two incoming pulses of Waveform B. In other words, on the rising edge of a pulse of the Waveform B, the Waveform C on the line 20 will also rise from a low to a high level and will remain at this level until the next input pulse of the Waveform B rises from a low to a high level, at which time the Waveform C will drop from its high to its low level. For the purpose of this description a high level may be considered a logic "1" signal and a low level logic "0" signal.

The Waveform C is supplied on the line 20 to the lines 22 and 24. The line 22 initiates a one-shot multivibrator 26 so that it provides a Waveform signal D on the line 41 each time the Waveform C goes from a low to a high level. The duration of the pulse from the one-shot 26 is substantially shorter than the duration of the pulses of the Waveform C. The inverter 28 inverts the Waveform D and supplies this signal to one input of an AND gate 30, the other input of which receives Waveform C supplied on the line 24. The output of the AND gate 30 will thus be Waveform E, which will be at a high level whenever Waveform C is at a high level and Waveform D is at a low level.

Waveform E is supplied to one input of an AND gate 30, the other input of which has Waveform F supplied to it from a continuously running clock source 34. The Waveform F pulses from the clock source 34 are at a much higher rate than the pulses of Waveform B, and, hence are at a higher rate than the frequency of the incoming signal Waveform A. The purpose of the high frequency clock Waveform F is to provide a timing interval count for accurately measuring the duration of high level portion of the pulses of the Waveform B. In order to provide an accurate counting of the duration, or width, of the pulses of Waveform B, the clock Waveform F should be at a much larger frequency than the Waveform B. To achieve 10-bit accuracy, for example, the clock rate must be on the order of 1,000 times the signal frequency. Therefore, if the Waveform A has a carrier frequency on the order of 10 kiloHertz, a clock frequency ot the clock 34 should be on the order of 10 megaHertz.

The output of the AND gate 32 provides Waveform G which is suplied on a line 36 to the counting input of the counter 38, while the Waveform D from the one-shot 26 is supplied on the line 41 to the clock input terminal of the counter 38. The counter 38 counts the number of pulses of the clock 34 that pass through the AND gate 32 during the time the Waveform E is at its high or logic "1" state. The output of the counter 38 consists of multiple lines 40, equal to the number of stages of the counter, which are arranged in a cable 42 that is coupled to a cable 44 which supplies multiple line digital data to a microcomputer (not shown) which utilizes the demodulated information. The cable 42 is also connected to the multiple line cable 46, which supplies the digital output of the counter 38 on the lines 48 to a digital-to-analog converter 50.

The digital-to-analog converter 50 is an optional feature which may be employed to supply a display device, or other processing equipment, with analog information which corresponds to the digital information supplied to the cable 44. The output of the digital-to-analog converter is coupled on the line 52 to a gated amplifier 54. When gated "on" the amplifier 54 passes the analog signal on the line 52 to a sample-and-hold circuit which stores the analog signal and supplies it on the line 58 to utilization circuitry (not shown). The amplifier 54 is gated "on" by a high level signal on the line 60 which is controlled by the one-shot 62. The one-shot 52 has its input coupled to a junction point 68 located between a resistor 64 and a capacitor 66 which is coupled to ground. The other end of the resistor 64 is coupled to the $\overline{Q}$ output of the JK flip-flop 16. The $\overline{Q}$ signal that is coupled through the resistor 64 to the junction point 68, therefore, is the inverse to the Waveform C. The resistor 64 and the capacitor 66 act to provide a delay in activating the one-shot 62 in order to insure that the data is stabilized in the digital-to-analog converter 50 before the amplifier 54 is gated "on" by the Waveform H on the line 60. The Waveform H may also be supplied on the line 70 to the microcomputer which receives the digital information on the cable 44, or to the processing equipment which receives the analog signal on the line 58, to indicate that the data that has been detected is ready to be sent to the remote device.

What is claimed is:

1. An FM demodulator, comprising:
    means for receiving a cyclic frequency modulated signal;
    signal responsive means coupled to said receiving means for producing a train of signal pulses, said train of signal pulses having a frequency equal to one-half of the frequency of said frequency modulated signal, said signal pulses each having a pulse width equal to one full cycle of said frequency modulated signal;
    digital timing means for generating a train of digital timing pulses at a frequency higher than the frequency of said signal pulses;
    counter means coupled to said digital timing means for counting said digital timing pulses;
    gating means coupled to said digital timing means, to said signal responsive means and to said counter means, for providing a reset signal to said counter means in response to the beginning of one of said signal pulses, for gating through said digital timing following said reset pulse, and in response to the end of said signal pulse for preventing said digital timing pulses from passing through to said counter means; and
    second timing means coupled to said counter and said signal responsive means for generating a read signal in response to the end of said signal pulse, said read signal indicating that said counter means contains a count indicative of the frequency of said frequency modulated signal.

2. An FM demodulator according to claim 1 wherein said second timing means generates said read signal after a predetermined delay following the end of said signal pulse.

* * * * *